US010018675B1

(12) United States Patent
Titley et al.

(10) Patent No.: US 10,018,675 B1
(45) Date of Patent: Jul. 10, 2018

(54) TESTING AN INTEGRATED CIRCUIT IN USER MODE USING PARTIAL RECONFIGURATION

(71) Applicant: Altera Corporation, San Jose, CA (US)

(72) Inventors: Adam Titley, Bracknell (GB); Roger May, Deddington (GB)

(73) Assignee: Altera Corporation, San Jose, CA (US)

( * ) Notice: Subject to any disclaimer, the term of this patent is extended or adjusted under 35 U.S.C. 154(b) by 397 days.

(21) Appl. No.: 14/212,160

(22) Filed: Mar. 14, 2014

(51) Int. Cl.
*G06F 9/445* (2018.01)
*G06F 1/12* (2006.01)
*G06F 17/50* (2006.01)
*G01R 31/3177* (2006.01)

(52) U.S. Cl.
CPC ............ *G01R 31/3177* (2013.01); *G06F 1/12* (2013.01); *G06F 9/44505* (2013.01); *G06F 17/505* (2013.01)

(58) Field of Classification Search
None
See application file for complete search history.

(56) References Cited

U.S. PATENT DOCUMENTS

| | | | | |
|---|---|---|---|---|
| 5,636,227 A | * | 6/1997 | Segars | G01B 31/318561 714/729 |
| 7,058,534 B1 | * | 6/2006 | Tracy | G01R 31/318516 702/117 |
| 7,138,820 B2 | | 11/2006 | Goetting et al. | |
| 7,266,741 B2 | * | 9/2007 | Luk | G01R 31/31835 714/724 |
| 7,302,625 B1 | | 11/2007 | Payakapan et al. | |
| 7,376,872 B1 | * | 5/2008 | Nelson | G01R 31/318544 714/718 |
| 7,376,915 B1 | * | 5/2008 | Duewer | G01B 31/318536 716/119 |
| 7,409,610 B1 | | 8/2008 | Drimer | |
| 7,529,998 B2 | | 5/2009 | Réblewski | |
| 7,610,523 B1 | * | 10/2009 | Singh | G11C 29/42 365/200 |

(Continued)

FOREIGN PATENT DOCUMENTS

| | | | | |
|---|---|---|---|---|
| WO | 2005111640 | 11/2005 | | |
| WO | WO 2013076529 A1 | * | 5/2013 | ............. G06F 13/14 |

*Primary Examiner* — Justin R Knapp
(74) *Attorney, Agent, or Firm* — Vineet Dixit

(57) ABSTRACT

A programmable integrated circuit may implement a safety function in a first region and a non-safety function in a second region of the programmable integrated circuit. The safety function may require that periodic tests verify the integrity of the programmable integrated circuit during safety test intervals. For this purpose, the programmable integrated circuit may halt the operation of the safety function, partially reconfigure the first region by loading a test function, and execute the test function, while the non-safety function in the second region continues to operate. In the event that the test function executed successfully without finding any defects, the programmable integrated circuit may partially reconfigure the first region by re-loading the safety function. Additional tests may be performed if the test function detected problems with the integrity of the programmable integrated circuit.

20 Claims, 5 Drawing Sheets

(56) References Cited

U.S. PATENT DOCUMENTS

| | | | | |
|---|---|---|---|---|
| 7,707,472 | B1* | 4/2010 | Dastidar | G11C 29/16 714/718 |
| 8,001,437 | B2* | 8/2011 | Wen | G01R 31/31813 714/736 |
| 9,449,717 | B2* | 9/2016 | Becker | G11C 29/14 |
| 2007/0115024 | A1 | 3/2007 | Goetting et al. | |
| 2012/0065919 | A1* | 3/2012 | Brown | G01R 31/31816 702/117 |
| 2012/0226942 | A1* | 9/2012 | Gangasani | G06F 11/27 714/30 |
| 2013/0151793 | A1 | 6/2013 | Rudosky et al. | |
| 2014/0201583 | A1* | 7/2014 | Thomas | G01R 31/3177 714/727 |
| 2015/0137841 | A1* | 5/2015 | Thanner | G01R 31/31701 324/750.3 |
| 2015/0178102 | A1* | 6/2015 | Regner | G06F 13/14 713/100 |

* cited by examiner

TESTING AN INTEGRATED CIRCUIT IN USER MODE USING PARTIAL RECONFIGURATION

BACKGROUND

This invention relates to integrated circuits, and more particularly, to operating a safety function including the execution of test functions on an integrated circuit.

A safety function or a safety critical application is an application whose failure may have considerable and often unacceptable consequences including substantial economic and financial damage, extensive damage to the environment, and loss of life. Many safety critical applications rely on or are implemented on integrated circuits, and operating a safety function generally requires testing the integrated circuit's integrity at regular safety test intervals.

An integrated circuit that enters a safety test interval is often required to leave the user mode in which the safety function is executed and to enter a test mode in which the integrated circuit and potentially all the devices chat are coupled to or controlled by the integrated circuit are forced offline. After entering test mode, a test function is executed which verifies the correct operation of the integrated circuit.

The test function is often implemented with limited reliance upon external control and test equipment and is sometimes referred to as a built-in self-test (BIST). Executing a BIST can consume a significant amount of time due to the high degree of coverage required by the BIST. The duration of the BIST usually increases with the complexity of the tested integrated circuit and the frequency at which the test function is required to be executed.

Consequently, a lot of time and resources are eventually wasted during the execution of the test function during which the integrated circuit and potentially all devices that are coupled to or controlled by the integrated circuit are idle.

SUMMARY

In accordance with certain aspects of the invention, an integrated circuit may load user configuration data that implements first and second functions (e.g., a safety function and a non-safety function) on the integrated circuit. The user configuration data associated with the first function may be loaded into a first region on the integrated circuit, and the user configuration data associated with the second function may be loaded into a second region on the integrated circuit.

During a first duration of time, the integrated circuit may operate as configured by the user configuration data. At a predetermined time, the integrated circuit may halt the operation of the first function and partially reconfigure the integrated circuit by loading test configuration data including a test function into the first region on the integrated circuit. The integrated circuit may execute the test function in the first region, while the second region of the integrated circuit continues to execute the second function.

It is appreciated that the present invention can be implemented in numerous ways, such as a process, an apparatus, a system, a device, or instructions executed on a programmable processor. Several inventive embodiments are described below.

In certain embodiments, the test function may produce measured results by executing the test function in the first region on the integrated circuit based on the test configuration data and compare the measured results with expected results to produce test results.

If desired, the test, function may analyze the test results to determine whether the first region on the integrated circuit is defective.

The test function may determine that the first region on the integrated circuit is not defective, and the integrated circuit may partially reconfigure the first region by reloading the user configuration data associated with the first function into the first region. The integrated circuit may then resume operation of the first function in the first region on the integrated circuit as configured by the user configuration data.

Alternatively, the test function may determine that the first region on the integrated circuit is defective. The integrated circuit may then perform an error recovery procedure.

Further features of the invention, its nature and various advantages, will be more apparent from the accompanying drawings and the following detailed description of the preferred embodiments.

DETAILED DESCRIPTION

The present invention relates to integrated circuits, and more particularly, to operating a safety function including the execution of test functions on an integrated circuit.

A non-safety function is a function whose failure has limited consequences, whereas a safety function or a safety critical application is an application whose failure may have considerable and often unacceptable consequences including substantial economic and financial damage, extensive damage to the environment, and loss of life. Medical care, aircraft, automobiles, nuclear power plants, and weapon's technologies are examples for areas that are considered to include safety functions. An insulin pump, a ground proximity warning system, an anti-lock braking system, and a temperature control system are all safety function examples from those respective areas, whereas a fever thermometer, on-board entertainment systems, and a video system in a visitor's center are non-safety function examples from those same areas.

During a safety test interval, which may occur periodically, an integrated circuit or at least a portion thereof that executes a safety function is often required to leave the user mode (i.e., by halting the safety function) and to enter a test mode. During test mode, a test function such as a built-in self-test (BIST) may verify the correct operation of the integrated circuit or at least the portion thereof that implements the safety function. Entering test mode and executing the test function may force the entire integrated circuit to leave user mode, which takes the entire integrated circuit and potentially all the devices that are coupled to or controlled by the integrated circuit offline.

It may therefore be desirable to limit the execution of the test function to the portion of the integrated circuit that implements the safety function, while the remainder of the integrated circuit continues to operate in user mode, thereby reducing the impact of executing the test function on the remainder of the integrated circuit and the devices that are coupled to or controlled by the integrated circuit.

It will be recognized by one skilled in the art, that the present exemplary embodiments may be practiced without some or all of these specific details. In other instances, well-known operations have not been described in detail in order not to unnecessarily obscure the present embodiments.

Figure 1:
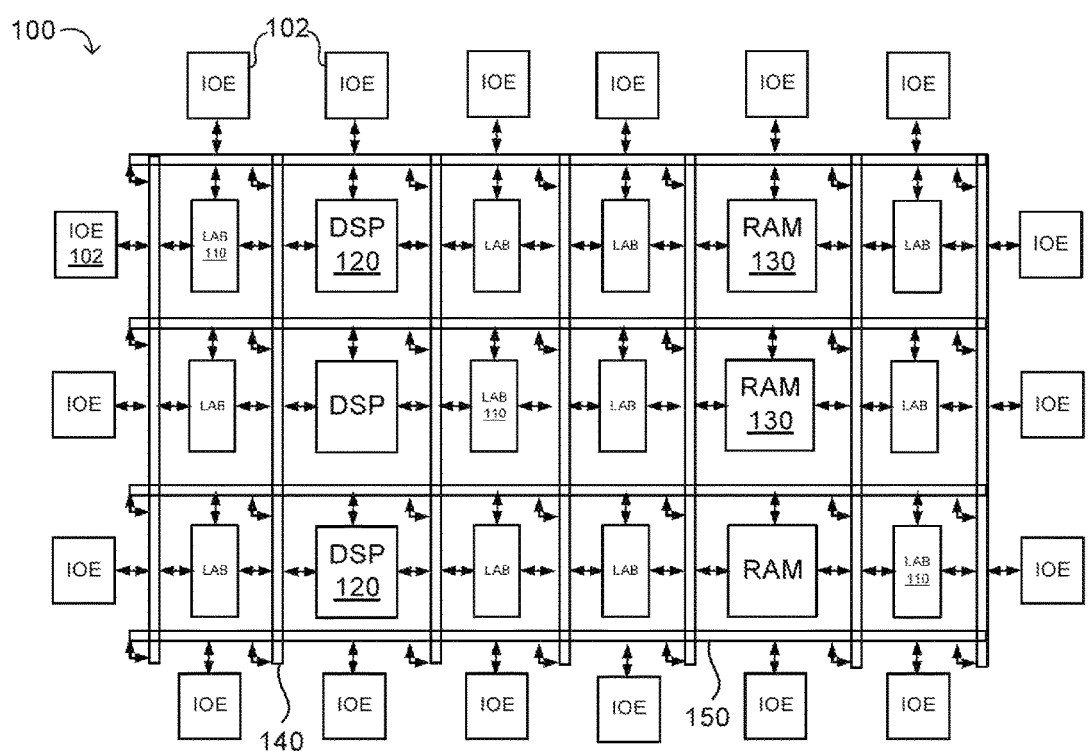
FIG. 1 is a diagram of an illustrative integrated circuit with partial reconfiguration support in accordance with an embodiment.

An illustrative embodiment of an integrated circuit such as a programmable logic device (PLD) 100 with a modified configurable storage block in accordance with the present invention is shown in FIG. 1. Programmable logic device 100 may have input/output circuitry 102 for driving signals off of PLD 100 and for receiving signals from other devices. Input/output circuitry 102 include conventional input/output circuitry, serial data transceiver circuitry, differential receiver and transmitter circuitry, or other circuitry used to connect one integrated circuit to another integrated circuit.

As shown, input/output circuitry 102 may be located around the periphery of the chip. If desired, the programmable logic device may have input/output circuitry 102 arranged in different ways. For example, input/output circuitry 102 may form one or more columns of input/output circuitry that may be located anywhere on the programmable logic device (e.g., distributed evenly across the width of the PLD). If desired, input/output circuitry 102 may form one or more rows of input/output elements (e.g., distributed across the height of the PLD). Alternatively, input/output circuitry 102 may form islands of input/output elements that may be distributed over the surface of the PLD or clustered in selected regions.

Vertical interconnection resources 140 and horizontal interconnection resources 150 such as global and local vertical and horizontal conductive lines and buses may be used to route signals on PLD 100. Vertical and horizontal interconnection resources 140 and 150 include conductive lines and programmable connections between respective conductive lines and are therefore sometimes referred to as programmable interconnects.

Programmable logic regions may include programmable components such as digital signal processing circuitry 120, storage circuitry 130, or other combinational and sequential logic circuitry organized in logic array blocks 110. The programmable logic regions may be configured to perform a custom logic function. If desired, the programmable logic region may include digital signal processing circuitry 120 and storage circuitry 130 which both may be organized in specialized blocks that have limited configurability. The programmable logic region may include additional specialized blocks such as programmable phase-locked loop circuitry, programmable delay-locked loop circuitry, or other specialized blocks with limited configurability.

Programmable logic device 100 contains programmable memory elements. These memory elements can be loaded with configuration data (sometimes also referred to as programming data) using input/output circuitry 102. Once loaded, the memory elements each provide a corresponding static control signal that controls the operation of an associated logic component in a programmable logic region. In a typical scenario, the outputs of the loaded memory elements are applied to the gates of transistors in the programmable logic region to turn certain transistors on or off and thereby configure the logic and the routing paths In the programmable logic region. Programmable logic circuit elements that may be controlled in this way include parts of multiplexers (e.g., multiplexers used for forming routing paths in programmable interconnects), look-up tables, logic arrays, AND, OR, NAND, and NOR logic gates, pass gates, etc.

Memory elements may use any suitable volatile and/or non-volatile memory structures such as random -access-memory (RAM) cells, fuses, antifuses, programmable read-only-memory memory cells, mask-programmed and laser -programmed structures, combinations of these structures, etc. Because memory elements are loaded with configuration data during programming, memory elements are sometimes referred to as configuration memory, configuration RAM, or programmable memory elements.

The circuitry of programmable logic device 100 may be organized using any suitable architecture. As an example, the logic of programmable: logic device 100 may be organized in a series of rows and columns of larger programmable logic regions each of which contains multiple smaller logic regions. The smaller regions may be, for example, regions of logic that are sometimes referred to as logic elements (LEs), each containing a look-up table, one or more registers, and programmable multiplexer circuitry. The smaller regions may also be, for example, regions of logic that are sometimes referred to as adaptive logic modules (ALMs). Each adaptive logic module may include a pair of adders, a pair of associated registers and a look -up table or other block of shared combinational logic (i.e., resources from a pair of LEs—sometimes referred to as adaptive logic elements or ALEs in this context). The larger regions may be, for example, logic array blocks (LABs) containing multiple logic elements or multiple ALMs.

During device programming, configuration data is loaded into programmable logic device 100 that configures the programmable logic regions so that their logic resources perform desired logic functions.

Programmable logic device 100 may support partial reconfiguration (PR). In a non-partial reconfiguration flow, changing one part of a design may require reprogramming all memory elements in the programmable logic device 100. Partial reconfiguration may allow to dynamically reprogram selected memory elements in a predetermined region of programmable logic device 100. Partial reconfiguration may perform the reprogramming of selected memory elements independent of the memory elements in other regions of programmable logic device 100, and most of the other regions may continue executing according to their configuration.

A partial reconfiguration design may include a static region, and one or more partial reconfiguration regions. The static region is the area of the programmable logic device 100 that may not be reconfigured without reprogramming the entire programmable logic device 100. An area of the programmable logic device 100 that may be partially reconfigured is a partial reconfiguration region. Partial reconfiguration regions may be associated with a logical design partition that supports multiple implementations.

A partial reconfiguration region may be reprogrammed independently to implement one of the multiple implementations. For this purpose, the memory elements that are contained within the partial reconfiguration region need to be reprogrammed.

During partial reconfiguration, host logic may interact with a partial reconfiguration control block to safely implement replacement logic in one or more partial reconfiguration regions. The host logic may send a freeze signal to the partial reconfiguration region, and accommodate handshaking with the partial reconfiguration control block so that clock, data, and other signals are implemented properly in memory elements. Host logic may be internal to programmable logic device 100, or communicate with the partial reconfiguration control block and the partial reconfiguration regions from an external source via input/output circuitry 102.

Figure 2A:
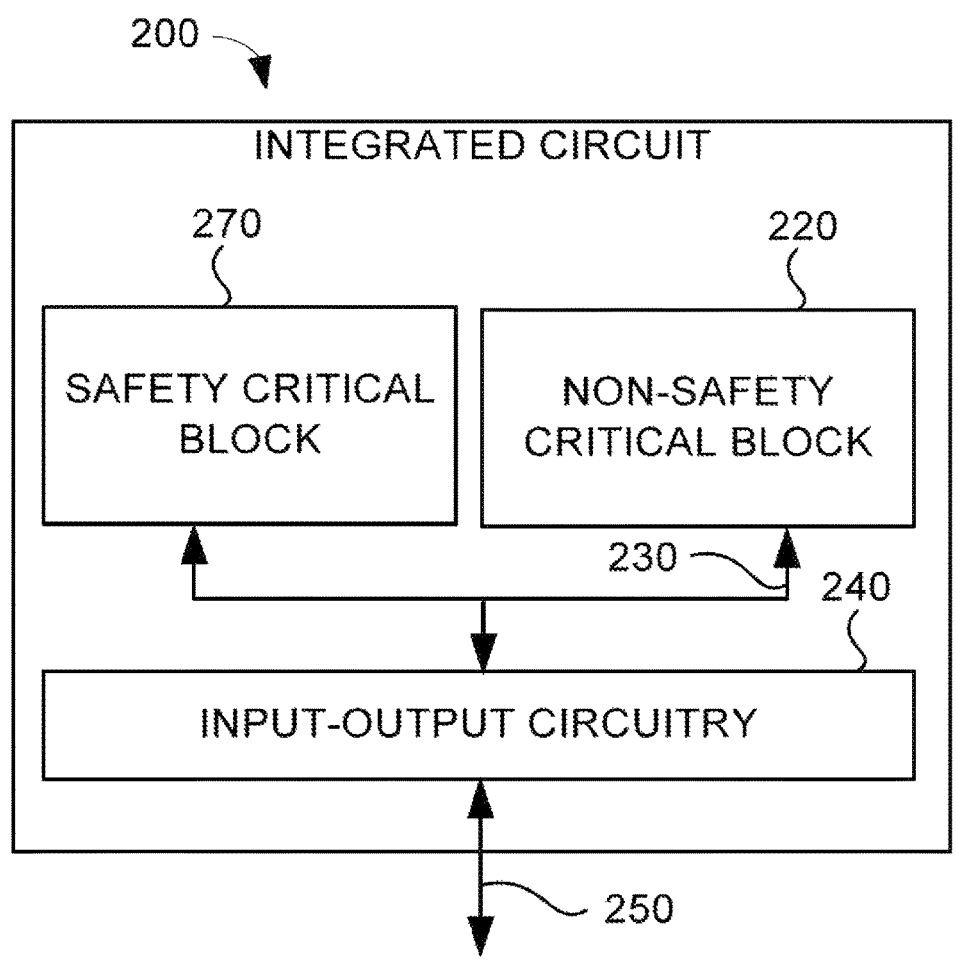
FIG. 2A is a diagram of an illustrative integrated circuit with a safety critical block and a non-safety critical block in accordance with an embodiment.

FIG. 2A is a diagram of an illustrative integrated circuit 200 in accordance with the present invention. Integrated circuit 200 may implement a safety function in safety critical block 270 in a first region of integrated circuit 200 and a non-safety function in non-safety critical block 220 in a second region of integrated circuit 200.

As an example, consider a Fieldbus controlled motor drive. The motor drive may have a safety element connected to the motor and a Fieldbus. The Fieldbus, which includes industrial computer network protocols for real-time distributed control applications may be considered a non-safety function because the Fieldbus is protected by other means (e.g., by cyclic redundancy check (CRC) circuitry, unique sender and receiver identification, etc.). It may be desirable to maintain the Fieldbus in user mode while the safety element that is connected to the motor drive is in test mode and executes a BIST function (e.g., to avoid network renegotiation or boot time for the Fieldbus).

Integrated circuit 200 may be a programmable logic device such as programmable logic device 100 of FIG. 1. In this example, safety critical block 270 may occupy a first partial reconfiguration region, whereas non-safety critical block 220 occupies a second partial reconfiguration region or a static region (i.e., a fixed/non-reconfigurable region). Thus, the first partial reconfiguration region may execute the safety function, while the second reconfigurable or non-reconfigurable region executes the non-safety function.

Integrated circuit 200 may include more than one safety critical block 270 and/or more than one non-safety critical block 220. Additional safety critical blocks may implement any safety functions. For example, in N-modular redundant systems, N safety critical blocks may implement the same safety function at the same time, and the result produced by the majority of the N safety critical blocks may be considered to be correct. In this example, one or more safety critical blocks may halt operation and enter test mode while the remainder of the safety critical blocks continues to execute the safety critical function.

Integrated circuit 200 may also include input/output circuitry 240. Internal interconnection resources 230 such as conductive lines and busses may be used to send data from one component to another component or to broadcast data from one component to one or more other components.

External interconnection resources 250 such as conductive lines and busses, optical interconnect infrastructure, or wired and wireless networks with optional intermediate switches may be used to communicate with other devices. In certain embodiments, the internal interconnect resources 230, and/or the external interconnect resources 250 may be implemented using configurable interconnect circuitry.

Figure 2B:
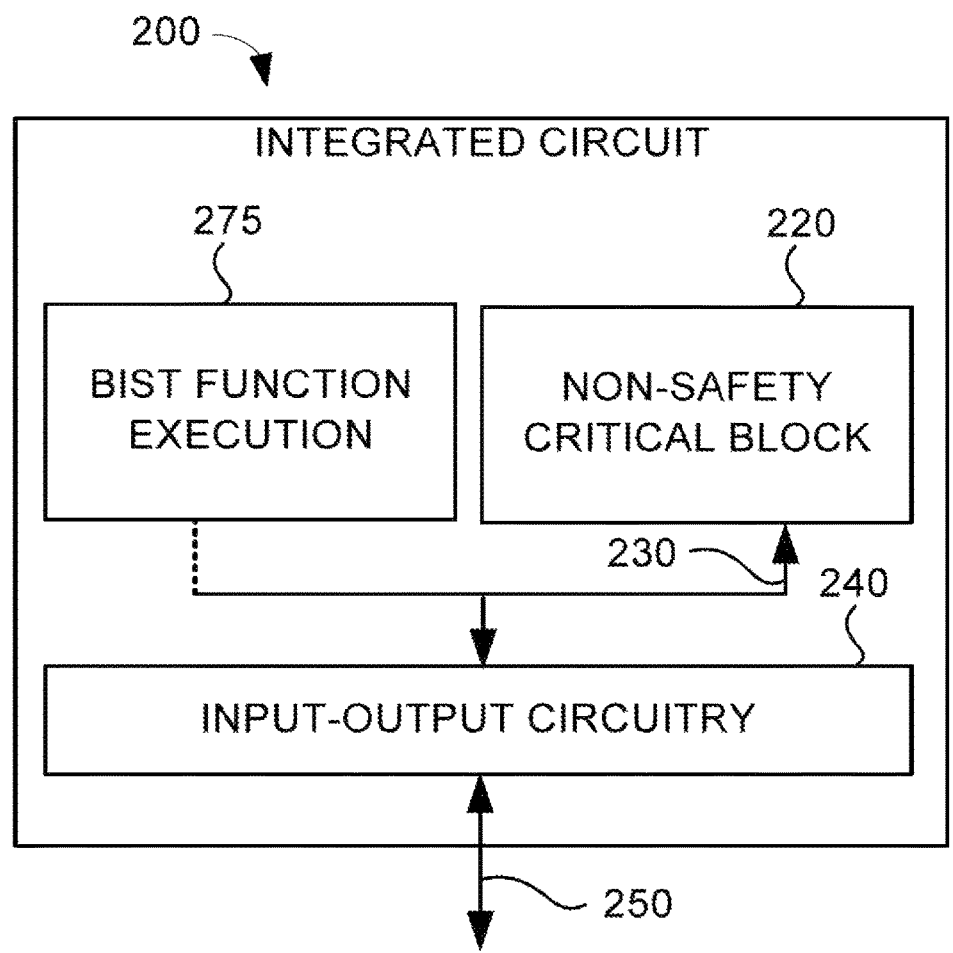
FIG. 2B is a diagram of an illustrative integrated circuit with a built-in self-test (BIST) function execution in a safety critical block in accordance with an embodiment.

During a safety test interval, safety critical block 270 may halt the execution of the safety function, take the safety critical block offline, and enter test mode. An embodiment of integrated circuit 200 with a safety critical block in test mode is shown in FIG. 2B.

During test mode, integrated circuit 200 may execute a BIST function 275 in a first region that may host a safety function during user mode, such as the region previously occupied by safety critical block 270 of FIG. 2A. For this purpose, integrated circuit 200 may take the first region "offline" (i.e., the first region may be disconnected from internal interconnect resources 230 during test mode).

Non-safety critical block 220 may continue executing the non-safety function while the BIST function is executed in the first region. As an example, consider that integrated circuit 200 may be a programmable logic device such as programmable logic device 100 of FIG. 1 with a safety function operating in a first partial reconfiguration region and a non-safety function operating in a second partial reconfiguration region or a static region.

Upon entering the test mode, the programmable logic device may partially reconfigure the first partial reconfiguration region by loading a configuration that implements the BIST function. When partial reconfiguration is completed, the programmable logic device may execute the BIST function in the first partial reconfiguration region.

Figure 3:
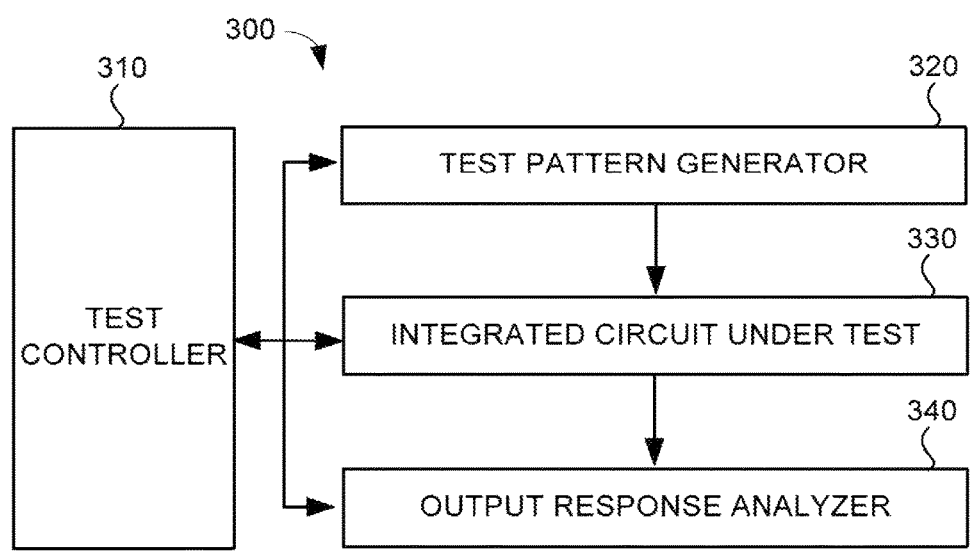
FIG. 3 is a diagram of an illustrative test infrastructure for performing tests on an integrated circuit in accordance with an embodiment.

An embodiment of a BIST function 300 is shown in FIG. 3. BIST function 300 may include test controller 310, test pattern generator 320, integrated circuit under test 330, and output response analyzer 340.

If desired, the safety critical block 270 of FIG. 2A may include all components of BIST function 300. In such a configuration, the safety critical function may be implemented in a portion of the safety critical block which may include the integrated circuit under test 330, while another portion of safety critical block 270 may be unused in user mode and include test controller 310, test pattern generator 320, and output response analyzer 340 in test mode.

Alternatively, test controller 310, test pattern generator 320, and output response analyzer 340 may be implemented in non-safety critical block 220 of FIG. 2A, while the integrated circuit under test 330 encompasses the entire safety critical block 270.

Test controller 310 may control the execution of the test. If desired, a storage circuit may store a predetermined set of test vectors. Alternatively, a test pattern generator 320 may generate test vectors for the integrated circuit under test 330. The test controller 310 may apply the test vectors to the integrated circuit under test 330.

As an example, a register scan chain may propagate a pseudorandom binary sequence (PBRS) through all registers in a given region of the programmable logic device. If desired, storage circuits in a given region of the programmable logic device may be tested by March algorithms in which zeroes and ones are successively written to and read front all addresses in the storage circuit.

If desired, BIST function 300 may include tests that are dedicated to verifying the behavior of the safety function in the environment in which the safety function is implemented. For example, the BIST function may test the effect of ambient temperature variation (e.g., a car that is driven during winter in Northern Alaska where temperatures can drop below −50 degrees Fahrenheit vs. the same car that is driven through Death Valley, Calif. during summer where average temperatures are above 110 degrees Fahrenheit during July and August) on the safety function implementation in the integrated circuit.

An output response analyzer 340 may compare the response of the integrated circuit under test 330 to the test vectors with results that may be expected for those test vectors in the event that the integrated circuit under test 330 performs correctly. A mismatch between the expected results and the response of the integrated circuit under test 330 may indicate a defect in the integrated circuit under test 330.

BIST function 300 may include multiple individual tests and different individual tests may be performed at different safety test intervals. For example, a register scan chain test may be performed at every safety test interval, whereas all other BIST functions are executed only at every other safety test interval.

Any mismatches detected during the execution of the test function may indicate potential defects in the programmable logic device and may require further investigation.

In the event that, the BIST function doesn't detect any defects, the programmable logic device may partially reconfigure the first partial reconfiguration region by re-loading the configuration that implements the safety function. When partial reconfiguration is completed, the programmable logic device may execute the safety function in the first partial reconfiguration region.

Figure 4:
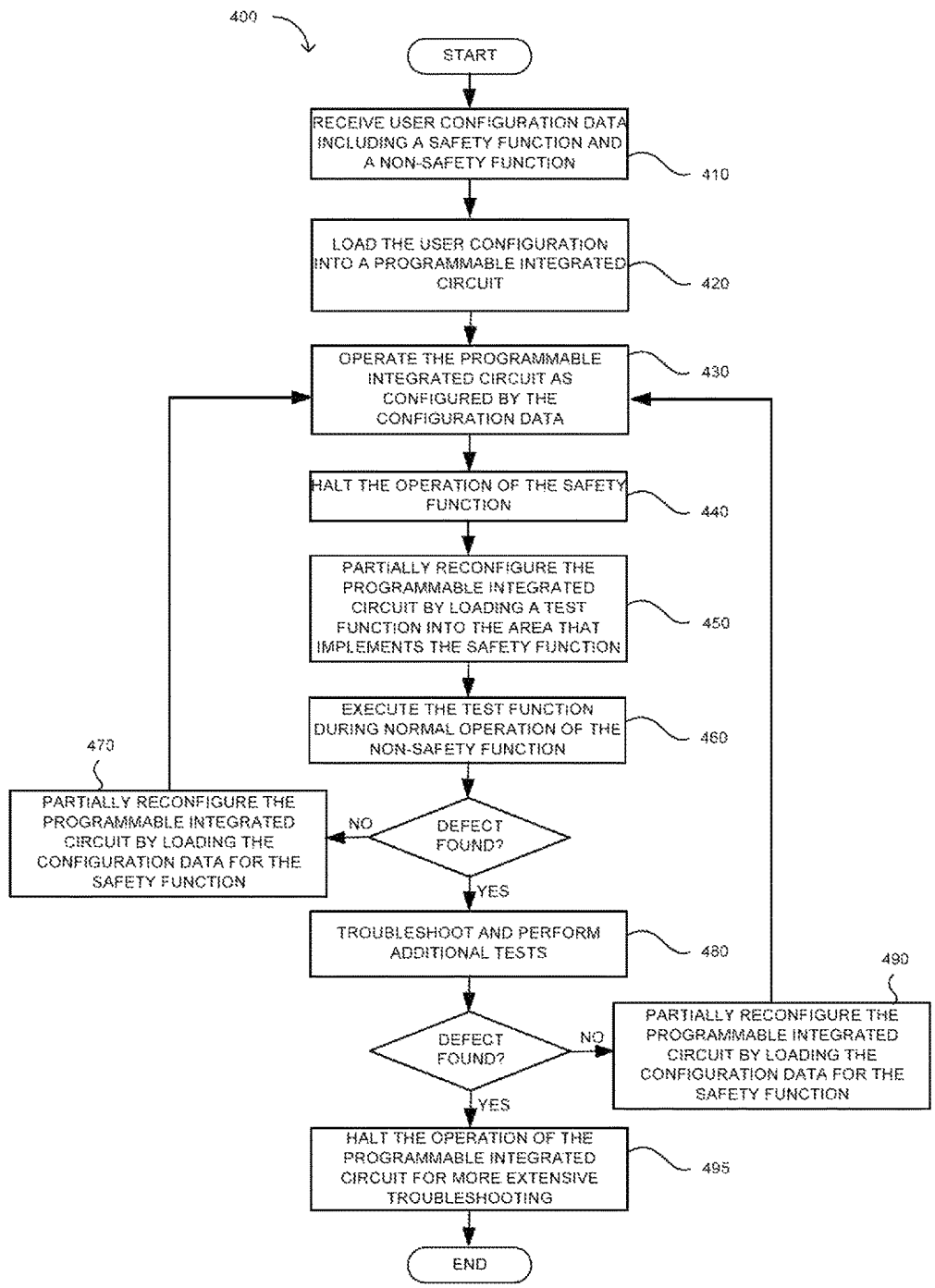
FIG. 4 is a flow chart of illustrative steps for operating a safety function and a non-safety function on an integrated circuit in accordance with an embodiment.

FIG. 4 shows a flow chart of illustrative steps that a system may perform when operating a safety function and a non-safety function on an integrated circuit such as programmable logic device 100 of FIG. 1. During step 410, the system may receive user configuration data, which may include a safety function and a non-safety function. During step 420, the system may load the user configuration data into a programmable integrated circuit such as programmable logic device 100 of FIG. 1. For example, the system may load the configuration data for the safety function into a first partially reconfigurable region and the configuration data for the non-safety function into a second region of the programmable integrated circuit.

During step 430, the system may operate the programmable integrated circuit as configured by the configuration data. The area of the programmable integrated circuit that implements the safety function may need to be tested periodically at safety test intervals. During step 440, the system may halt the operation of the safety function and partially reconfigure the programmable integrated circuit by loading a test function into the area that implements the safety function during step 450. For example, the system may partially reconfigure the first partially reconfigurable region of the programmable integrated circuit by loading configuration data that implements a BIST function.

During step 460, the system may execute the test function in the area of the programmable integrated circuit that implements the safety function while the non-safety function continues to operate as configured. In the event that the test function doesn't find a defect, the system may partially reconfigure the programmable integrated circuit by loading the configuration data for the safety function during step 470. For example, the system may partially reconfigure the first partially reconfigurable region of the programmable integrated circuit by loading configuration data that implements the safety function. From step 470, the system may return to executing step 430.

In the event that the test function does find a defect, the system may troubleshoot and perform additional tests during step 480 to determine whether the detected defect was wrongly flagged (e.g., if the detected defect was caused by a test equipment failure). In the event that the troubleshooting determines that the integrated circuit under test is fully functional and the additional tests don't find a defect after troubleshooting, the system may partially reconfigure the programmable integrated circuit by loading the configuration data for the safety function during step 490. For example, the system may partially reconfigure the first partially reconfigurable region of the programmable integrated circuit by loading configuration data that implements the safety function, From step 490, the system may return to executing step 430.

In the event, that the troubleshooting and the additional tests do find a defect in the integrated circuit under test, the system may halt the operation of the programmable integrated circuit for more extensive troubleshooting during step 495. For example, the system may re-initialize the programmable integrated circuit by re-loading the entire user configuration into the programmable integrated circuit and perform the BIST function again.

The method and apparatus described herein may be incorporated into any suitable electronic device or system of electronic devices. For example, the method and apparatus may be incorporated into numerous types of devices such as microprocessors or other ICs. Exemplary ICs include programmable array logic (PAL), programmable logic arrays (PLAs), field programmable logic arrays (FPLAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), just to name a few.

The integrated circuit described herein may be part of a data processing system that includes one or more of the following components; a processor; memory; I/O circuitry; and peripheral devices. The integrated circuit can be used in a wide variety of applications, such as computer networking, data networking, instrumentation, video processing, digital signal processing, or any suitable other application where the advantage of using high-speed serial interface circuitry is desirable.

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the overlay operations are performed in a desired way.

The foregoing is merely illustrative of the principles of this invention and various modifications can be made by those skilled in the art without departing from the scope and spirit of the invention. The foregoing embodiments may be implemented individually or in any combination.

What is claimed is:

1. A method for operating an integrated circuit, comprising:
loading user configuration data that implements first and second functions on the integrated circuit, wherein the user configuration data that is associated with the first function is loaded into a first region on the integrated circuit, and wherein the user configuration data that is associated with the second function is loaded into a second region on the integrated circuit;
operating the first region on the integrated circuit to perform the first function based on the user configuration data;
operating the second region on the integrated circuit to perform the second function based on the user configuration data;
halting the operation of the first region to disable the first function without halting the operation of the second region on the integrated circuit;
in response to halting the operation of the first region, reconfiguring the first region on the integrated circuit by loading additional configuration data into the first region on the integrated circuit;
operating the reconfigured first region on the integrated circuit to perform a test function that is different from the first function based on the additional configuration data; and
producing test results using the test function while the second region on the integrated circuit implements the second function, and wherein the test results indicate whether a defect is present in the integrated circuit.

2. The method of claim 1, wherein the test function comprises instructions for executing a built-in self-test that verifies functionality of the first region on the integrated circuit.

3. The method of claim 1, wherein the test function comprises instructions for verifying functionality of the first function in the first region on the integrated circuit.

4. The method of claim 1, further comprising:
producing measured results by executing the test function in the first region on the integrated circuit based on the test configuration data; and
comparing the measured results with expected results to produce the test results.

5. The method of claim 4, wherein producing the measured results comprises:
applying test vectors to at least a portion of the first region on the integrated circuit; and
in response to applying the test vectors, measuring a corresponding response in the first region of the integrated circuit.

6. The method of claim 1, further comprising:
analyzing the test results to determine whether the first region on the integrated circuit is defective.

7. The method of claim 6, further comprising:
in response to determining that the first region on the integrated circuit is not defective, partially reconfiguring the integrated circuit by reloading the user configuration data that is associated with the first function into the first region on the integrated circuit; and
resuming operation of the first function in the first region on the integrated circuit as configured by the user configuration data.

8. The method of claim 6, further comprising:
in response to determining that the first region on the integrated circuit is defective, performing an error recovery procedure.

9. The method of claim 8, wherein the error recovery procedure comprises:
terminating operation of the integrated circuit as configured by the user configuration data; and
performing additional tests to determine whether the integrated circuit is defective.

10. The method of claim 9 further comprising:
in response to determining that the integrated circuit is not defective, loading the user configuration data that implements the first and second functions on the integrated circuit, wherein the user configuration data associated with the first function is loaded into the first region on the integrated circuit, and wherein the user configuration data associated with the second function is loaded into the second region on the integrated circuit; and
operating the integrated circuit as configured by the user configuration data.

11. The method of claim 9 further comprising:
in response to determining that the integrated circuit is defective, replacing the integrated circuit with a new integrated circuit.

12. A method, comprising:
receiving user configuration data for a circuit;
configuring the circuit by loading the user configuration data into memory on the circuit;
performing a first function at a portion of the configured circuit;
halting the operation of the portion of the configured circuit;
reconfiguring the portion of the circuit based on the user configuration data to perform a built-in self-test (BIST) that is different from the first function;
producing first test results based on the BIST;
in response to detecting a defect in the circuit based on the first test results, performing an additional test to confirm the defect detected in the circuit;
producing second test results based on the additional test; and
in response to confirming the defect detected in the circuit based on the second test results, halting the circuit.

13. The method of claim 12, wherein reconfiguring the portion of the circuit comprises:
protecting a routing path in the reconfigured portion of the circuit from being reconfigured.

14. The method of claim 12, wherein producing the first test results comprises:
executing the built-in self-test in the reconfigured portion of the circuit to detect a defect in the circuit while a non-reconfigured portion of the circuit is operating according to the user configuration data.

15. The method of claim 14, wherein the reconfigured portion of the circuit comprises a first portion of the circuit, further comprising:
in response to detecting an absence of defects in the circuit, reconfiguring the first portion of the circuit by loading the user configuration data into the memory in the portion of the circuit.

16. An integrated circuit, comprising:
a first portion of the integrated circuit that executes a non-safety function; and
a second portion of the integrated circuit that is coupled to the first portion of the integrated circuit and that operates to execute a safety function in a first configuration, is halted in the first configuration to stop executing the safety function, reconfigures to a second configuration that is different from the first configuration by loading a test configuration after halting operation in the first configuration, and produces test results by executing the test configuration while the first portion of the integrated circuit is executing the non-safety function.

17. The integrated circuit of claim 16, wherein the safety function is executed in accordance with a functional safety standard that requires testing the second portion of the integrated circuit at regular safety test intervals.

18. The integrated circuit of claim 16, wherein the second portion of the integrated circuit further comprises:
a test pattern generator that generates test vectors and applies the test vectors to a subset of the second portion of the integrated circuit.

19. The integrated circuit of claim 18, further comprising:
an output response analyzer coupled to the subset of the second portion of the integrated circuit, wherein the output response analyzer receives the applied test vectors and compares the received test vectors to predetermined test vectors.

20. The integrated circuit of claim 19, further comprising:
a test controller that controls the execution of the test configuration by controlling the test pattern generator, the output response analyzer, and the application of the test vectors to the subset of the second portion of the integrated circuit.

\* \* \* \* \*